(12) United States Patent
Pugliano

(10) Patent No.: US 12,300,888 B2
(45) Date of Patent: May 13, 2025

(54) SYSTEM AND METHOD FOR ATTENUATING RADIATION EMISSIONS FROM EARPIECE DEVICES

(71) Applicant: Microsonic, Inc., Ambridge, PA (US)

(72) Inventor: Monika Pugliano, Ambridge, PA (US)

(73) Assignee: Microsonic, Inc., Ambridge, PA (US)

( * ) Notice: Subject to any disclaimer, the term of this patent is extended or adjusted under 35 U.S.C. 154(b) by 294 days.

(21) Appl. No.: 18/163,827

(22) Filed: Feb. 2, 2023

(65) Prior Publication Data

US 2024/0266750 A1 Aug. 8, 2024

(51) Int. Cl.
*H01Q 17/00* (2006.01)
*H04R 1/10* (2006.01)
*H05K 9/00* (2006.01)

(52) U.S. Cl.
CPC ......... *H01Q 17/008* (2013.01); *H04R 1/1016* (2013.01); *H04R 1/1091* (2013.01); *H05K 9/0083* (2013.01)

(58) Field of Classification Search
CPC .. H01Q 17/008; H04R 1/1016; H04R 1/1091; H05K 9/0083
See application file for complete search history.

(56) References Cited

U.S. PATENT DOCUMENTS

| | | | |
|---|---|---|---|
| 4,956,203 A | 9/1990 | Kroupa | |
| 5,075,038 A | 12/1991 | Cole et al. | |
| 6,309,563 B1 | 10/2001 | Iino et al. | |
| 6,411,722 B1 * | 6/2002 | Wolf | H04R 1/1058 381/370 |
| 6,902,688 B2 | 6/2005 | Narayan et al. | |
| 7,537,712 B2 | 5/2009 | Shima et al. | |
| 8,588,446 B2 | 11/2013 | Brunda | |
| 9,301,696 B2 | 4/2016 | LeBoeuf et al. | |
| 2002/0071551 A1 | 6/2002 | Lee | |
| 2003/0040345 A1 | 2/2003 | Berger et al. | |
| 2013/0123919 A1 | 5/2013 | Goldstein et al. | |

* cited by examiner

*Primary Examiner* — Mark Fischer
(74) *Attorney, Agent, or Firm* — LaMorte & Associates PC

(57) ABSTRACT

An earpiece radiation attenuation device that is used to attenuate UHF radiation emitted by an earpiece while the earpiece is being worn in an ear. The earpiece radiation attenuation device has an elastomeric molding that connects to the earpiece emitting the UHF radiation. The elastomeric molding contains metal powder and dielectric material that is homogenously dispersed within a polymer base. The metal powder and dielectric material with the polymer base attenuate UHF radiation in a synergistic manner. The metal powder includes a conductive powder and high-density powder. The conductive powder forms a shield to the UHF radiation. The high-density powder absorbs the UHF radiation. The dielectric material can be glass microspheres that are specifically sized to reflect the UHF radiation, wherein the reflected radiation cancels some of the incoming radiation.

20 Claims, 6 Drawing Sheets

SYSTEM AND METHOD FOR ATTENUATING RADIATION EMISSIONS FROM EARPIECE DEVICES

BACKGROUND OF THE INVENTION

1. Field of the Invention

In general, the present invention relates to earpiece devices with transceivers that emit electromagnetic radiation. More particularly, the present invention is related to earpiece devices that are housed within material that attenuates radiation emissions toward the ear without adversely effecting transmissions away from the ear.

2. Prior Art Description

Earpieces that contain electronics are used for a variety of purposes. For example, there are many makes and models of wireless earphones that enable a person to receive and hear transmissions from a smartphone or similar remote device. Likewise, there are many wireless earphones used by soldiers and first responders that enable a person to hear wireless transmissions from a radio carried elsewhere on the body. Typically, the transmissions between the earpiece device and the remote device are made using Bluetooth® transmissions.

Bluetooth® transmissions are ultra-high frequency (UHF) transmissions in the USM bands from 2.402 GHz to 2.48 GHz. Although such transmissions are not proven to cause cancer or other medical issues in the general population, it is known that some people are more sensitive to such emissions than are others. With such individuals, there is a link to headaches, tissue tenderness and possibly brain cancer. The dangerous effects of UHF radiation are directly proportional to the distance between the emission source and the tissue being affected. Accordingly, when a UHF transmitter is inserted into the ear canal and there are only millimeters separating the transmitter from brain tissue, the likelihood of the brain tissue having a reaction to the radiation is greatly increased.

In the prior art, there have been attempts to reduce UHF emissions from a wireless earpiece. Such prior art typically addresses the overall design of the earpiece. The earpiece typically positions the UHF transmitter as far outside the ear canal as possible and a sound tube is used to direct audible signals into the ear canal. The area around the sound tube is blocked with extra material to inhibit the passage of the radiation into the ear canal. However, the radiation is free to follow the sound into the ear canal through the sound tube. Such prior art is exemplified by U.S. Patent Application Publication No. 2013/0123919 to Goldstein. The problems with such earplugs are twofold. First, the attenuation features of such designs cannot be retroactively added to existing earpieces. As such, a person is required to purchase a separate specialty earpiece which may not have the same sound quality or operational features as the original earpiece. Second, the blocking material that seals the ear canal makes the earplug difficult to insert into narrow ear canals and can make the earpieces uncomfortable to wear. The blocking material may also become loose over time and fall into the ear canal which can cause a serious health hazard.

A need therefore exists for an improved radiation attenuation system that better inhibits UHF radiation from entering the auditory canal. A need also exists for an improved radiation attenuation system that can be retroactively added to existing earpieces. These needs are met by the present invention as described and claimed below.

SUMMARY OF THE INVENTION

An earpiece radiation attenuation device that is used to attenuate UHF radiation emitted by an earpiece while the earpiece is being worn in an ear. The earpiece radiation attenuation device has an elastomeric molding that connects to the earpiece emitting the UHF radiation. The elastomeric molding contains metal powder and dielectric material that is homogenously dispersed within a polymer base. The metal powder and dielectric material with the polymer base attenuate UHF radiation in a synergistic manner.

The metal powder includes a conductive powder and high-density powder. The conductive powder forms a shield to the UHF radiation. The high-density powder absorbs the UHF radiation. The dielectric material can be glass microspheres that are specifically sized to reflect the UHF radiation, wherein the reflected radiation cancels some of the incoming radiation. Together, the elastomeric molding acts to significantly attenuate the UHF radiation using only a small volume of material.

The elastomeric molding is positioned between the earpiece and the ear. The elastomeric molding can be shaped to engage both the earpiece and the ear, therein joining the earpiece to the ear.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Although the present invention earpiece radiation attenuation system is typically sold in pairs for protecting both the left and right earpieces, only one earplug is herein illustrated and described. It will be understood that the second earplug for the full set would have a mirrored geometry and would be manufactured and utilized in the same manner. The illustrated embodiment is selected for simplicity of description and represents one of the best modes contemplated for the invention. The illustrated embodiments, however, are merely exemplary and should not be considered a limitation when interpreting the scope of the appended claims.

Figure 1:
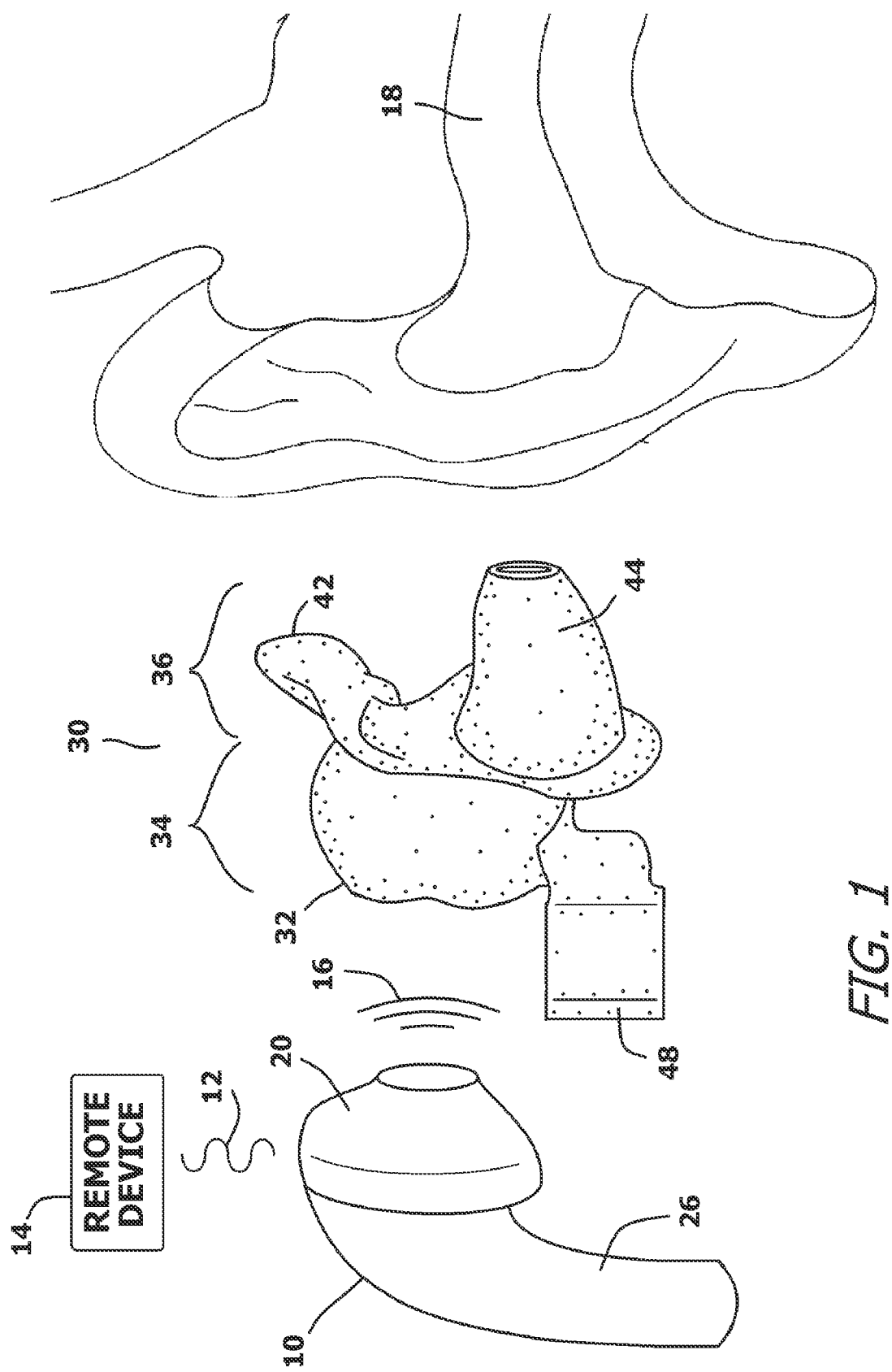
FIG. 1 shows an exemplary embodiment of an earpiece radiation attenuation system shown in conjunction with an earpiece and an ear.
Figure 2:
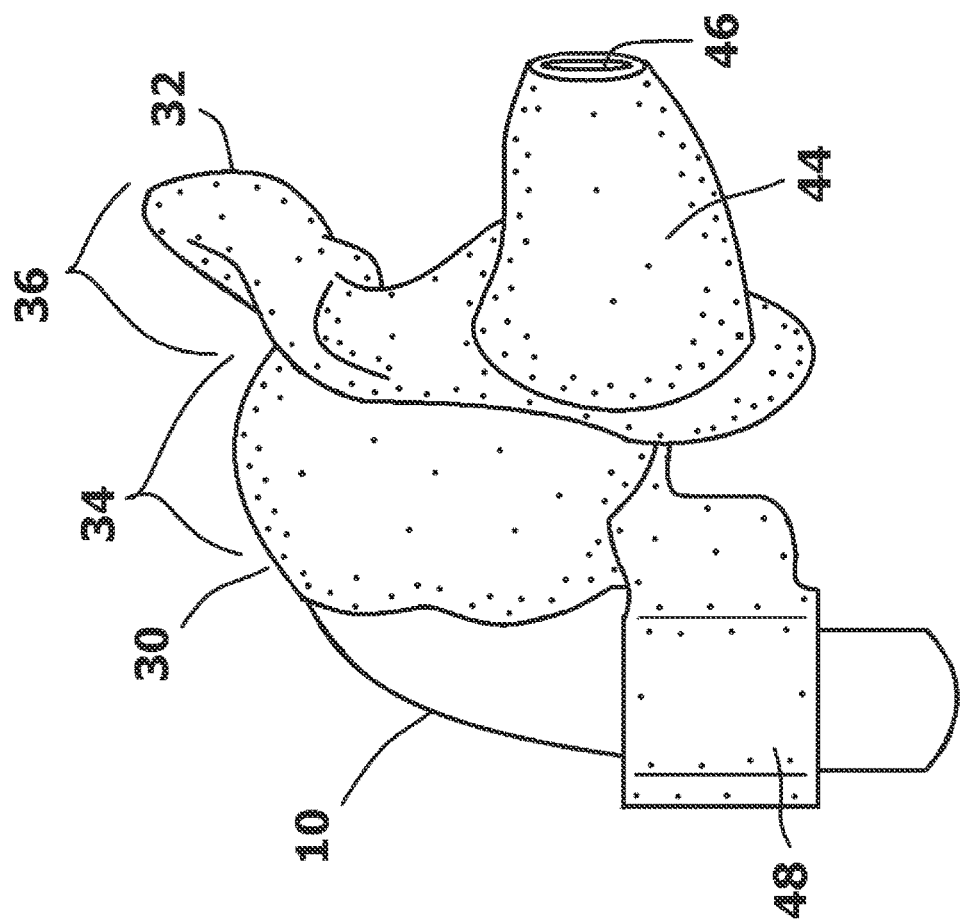
FIG. 2 shows the earpiece radiation attenuation system of FIG. 1 engaging both an earpiece and an ear.
Figure 3:
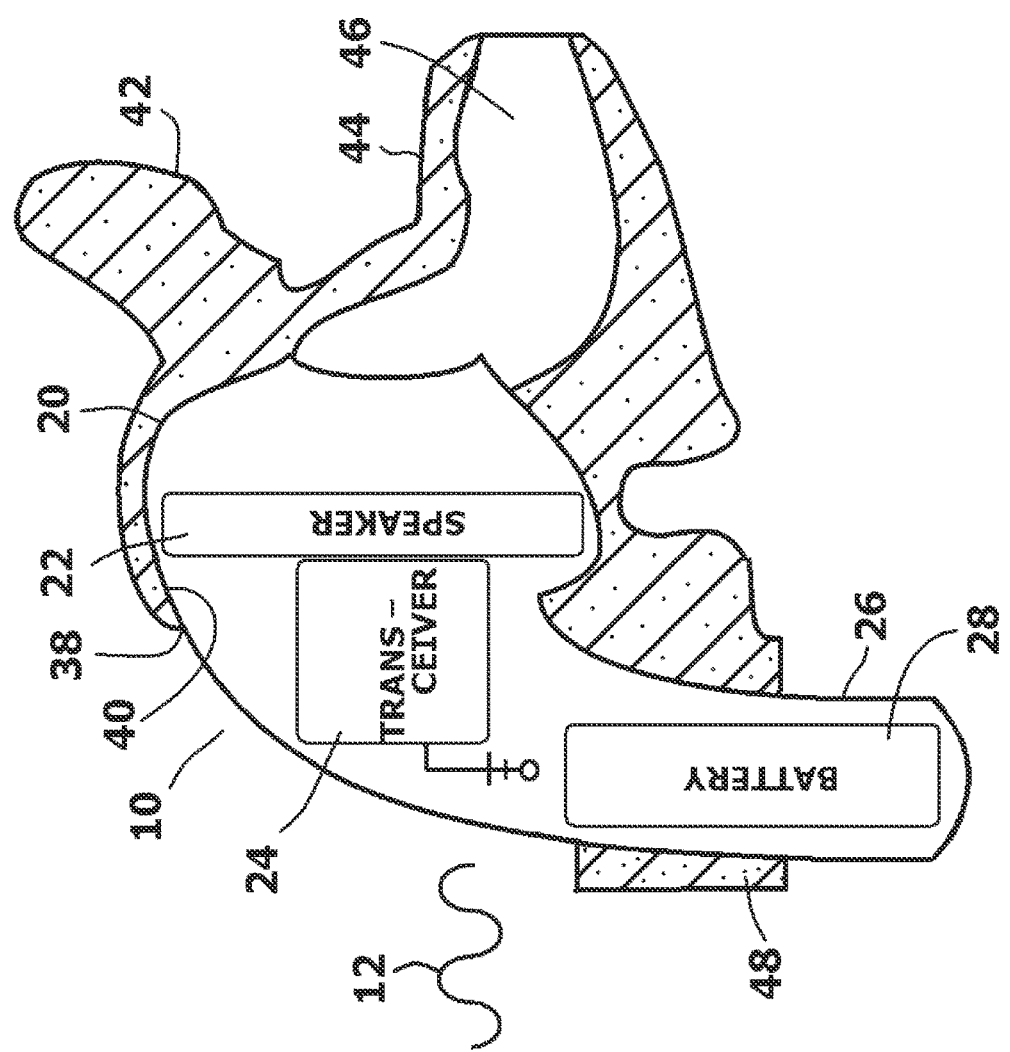
FIG. 3 is a cross-sectional view of the embodiment of FIG. 2.

Referring to FIG. 1 in conjunction with FIG. 2 and FIG. 3, an earpiece 10 is shown. The earpiece 10 is an Airpod® earpiece manufactured by Apple, Inc. as described in U.S.

Pat. No. 9,769,558. The earpiece is intended to be exemplary of any and all wireless earpieces that rest either in the auricle or auditory canal and house a transceiver for transmitting and receiving UHF radio transmissions. The earpiece 10 sends and receives UHF signals 12 to and from a remote device 14, such as a smartphone. The earpiece 10 converts some of the UHF signals 12 into audible signals 16. The audible signals 16 are directed toward the auditory canal 18. The UHF signals 12 emitted by the earpiece 10 are generally omnidirectional. That is, the UHF signals 12 are transmitted in all directions. As a result, many of the UHF signals 12 are transmitted directly into the user's head, neck and body.

The earpiece 10 typically has a bulbous head 20 that enters the auricle and/or auditory canal 18. Both the speaker 22 that emits audible signals 16 and the transceiver 24 that emits the UHF signals 12 are typically contained within the bulbous head 20. A stem 26 extends from the bulbous head 20. The stem 26 provides the handhold needed to grasp and hold the earpiece 10. The stem 26 also provides the room needed to house the rechargeable batteries 28 that power the earpiece 10. The stem 26 extends away from the ear. The rechargeable batteries 28 are typically contained in the stem 26 to prevent injury to the ear should the rechargeable batteries 28 short and become very hot or otherwise fail.

The earpiece radiation attenuation system 30 includes an elastomeric molding 32. The elastomeric molding 32 has a first section 34 and a second section 36. The first section 34 is hollow and has an access opening 38. The first section 34 defines an internal chamber 40 that is accessible through the access opening 38. The first section 34 can be stretched around the bulbous head 20 of the earpiece 10. This is done by stretching open the access opening 38 and advancing the bulbous head 20 of the earpiece 10 into the internal chamber 40.

The second section 36 of the elastomeric molding 32 is integrally molded with the first section 34. The second section 36 has a contoured flange 42 that extends into a conical plug 44. The contoured flange 42 is molded to conform to the incisura that leads into the outer auditory canal 18. The conical plug 44 is generally horn shaped and is sized to fit into the auditory canal 18. The overall second section 36 of the elastomeric molding 32 can be generally shaped to fit the average ear anatomy. However, it is preferred that the overall elastomeric molding 32 be custom molded to match the ear anatomy of a specific person. In this manner, the elastomeric molding 32 will conform perfectly with the anatomy of the user's ear. Since the second section 36 of the elastomeric molding 32 is custom fit to the incisura and outer auditory canal 18, a substantial interconnection is made that holds the overall earpiece radiation attenuation system 30 in place.

A conduit 46 extends through the center of the conical plug 44. The conduit 46 communicates with the internal chamber 40 within the first section 34. The conduit 46 provides a pathway for audible signals 16 generated by the earpiece 10 to propagate into the auditory canal 18.

An optional clip 48 can be connected to the elastomeric molding 32. The clip 48 is sized and positioned to engage the stem 26 of the earpiece 10. This helps prevent the earpiece 10 from being pulled out and away from the elastomeric molding 32. The clip 48 can be integrally molded as part of the overall elastomeric molding 32 or can be separately molded and attached to the elastomeric molding 32. It is preferred that the clip 48 be molded of different plastic than the elastomeric molding 32 so that the clip 48 does not embody the radiation blocking properties of the elastomeric molding 32. This prevents the clip 48 from blocking any incoming transmission should the antenna of the earpiece 10 be positioned within the stem 26.

Figure 4:
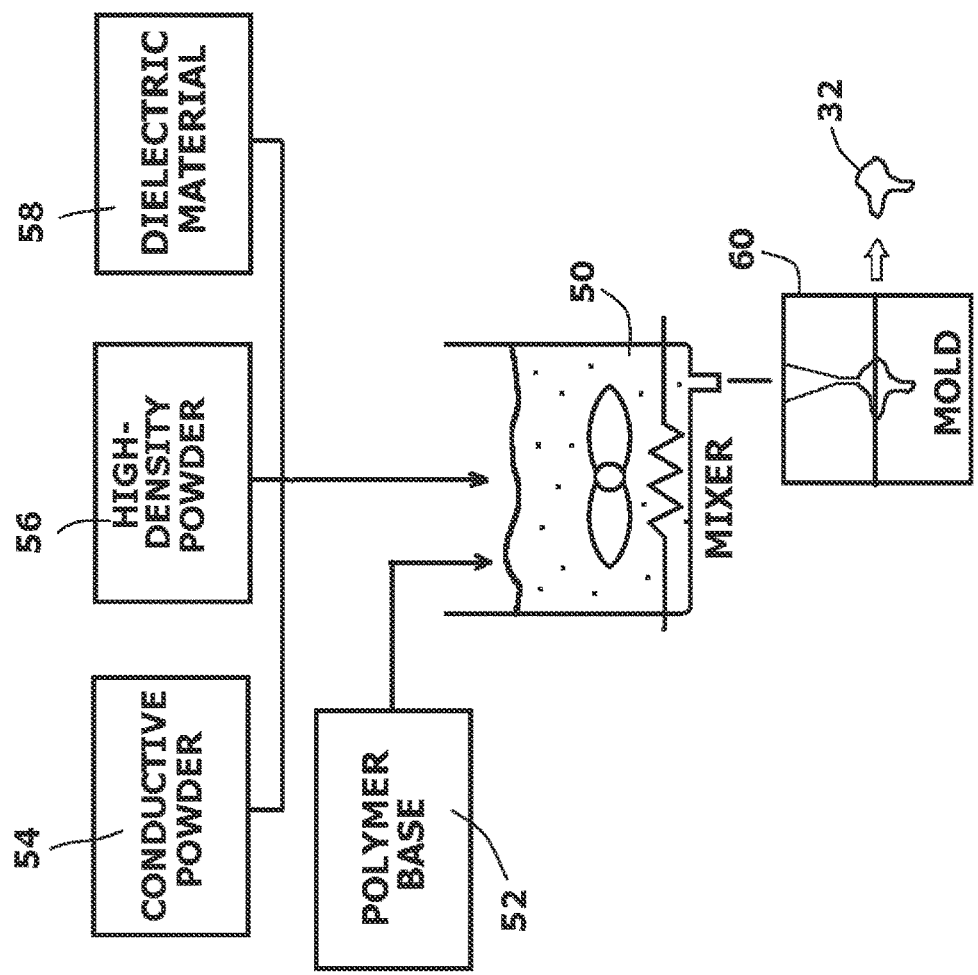
FIG. 4 is a block diagram schematic outlining an exemplary method of manufacture for the earpiece radiation attenuation system.

Referring to FIG. 4 it can be seen that the elastomeric molding 32 is made from a specialized compound 50 that is highly effective in blocking UHF radiation between 2.402 GHz to 2.48 GHZ. The compound 50 has a polymer base 52. The polymer base 52 is preferably silicone. However, synthetic thermoplastic rubbers can also be used. What is important is that the selected polymer base 52 cures and maintains shape at body temperature while being comfortable and safe against the skin. The polymer base 52 is mixed with additives while molten to form a homogenous compound. The additives include a highly conductive powder 54, a high-density powder 56, and a dielectric material 58, such as glass microspheres, ceramic beads, or processed sand. Within the specialized compound 50, the ingredients are present in the following ranges:

| Component | Parts by weight |
| --- | --- |
| Polymer base | 8.0-15.0 |
| Conductive powder | 0.5-5.0 |
| High-Density powder | 2.0-6.0 |
| Dielectric material | 0.1-1.0 |

The conductive powder 54 is made from material that is highly electively conductive. Additionally, the conductive powder 54 is preferably dense enough to absorb some of the UHF radiation. The preferred conductive powders 54 are powders of dense, highly conductive metals include powders of copper, silver, gold and zinc. Other, slightly less conductive martials, such as steel powder, brass powder, bronze powder can be used built are not preferred. Aluminum can be used, but is not preferred due to its low density. The most preferred conductive powder 54 are copper and silver. These materials are dense, highly conductive and have the added benefit of embodying antimicrobial properties that will help the elastomeric molding 32 resist microbial contamination.

The high-density powder 56 is made from high-density metal. The high-density metal need not be highly conductive. Although a high-density metal such as lead would work, the elastomeric molding 32 does contact the skin. Accordingly, toxic metal such as lead should be avoided. It is preferred that the high-density powder have a higher density than the metal selected for the conductive powder 54. As a result, if the conductive powder 54 is copper and has a density of 8.98 g/cc, then then a good choice for the high-density powder 56 would be tungsten, hastelloy or stainless steel. Of these materials, tungsten is preferred. Tungsten is topically non-toxic, relatively inexpensive and has a density of 19.3 g/cc.

During production, the polymer base 52 is made molten. The conductive powder 54, high-density powder 56 and dielectric material 58 are mixed into the molten polymer base 52. The molten compound 50 is continuously mixed to prevent the heavier additives from settling. While the polymer base 52 is molten and the specialized compound 50 is homogenous, the specialized compound 50 is fed into a molding machine 60. The elastomeric molding 32 is then produced. The molding machine 60 can produce general elastomeric moldings for people of various sizes. However, it is preferred that the molding machine is customized to product an elastomeric molding 32 that matches the anatomy of a specific person.

Figure 5:
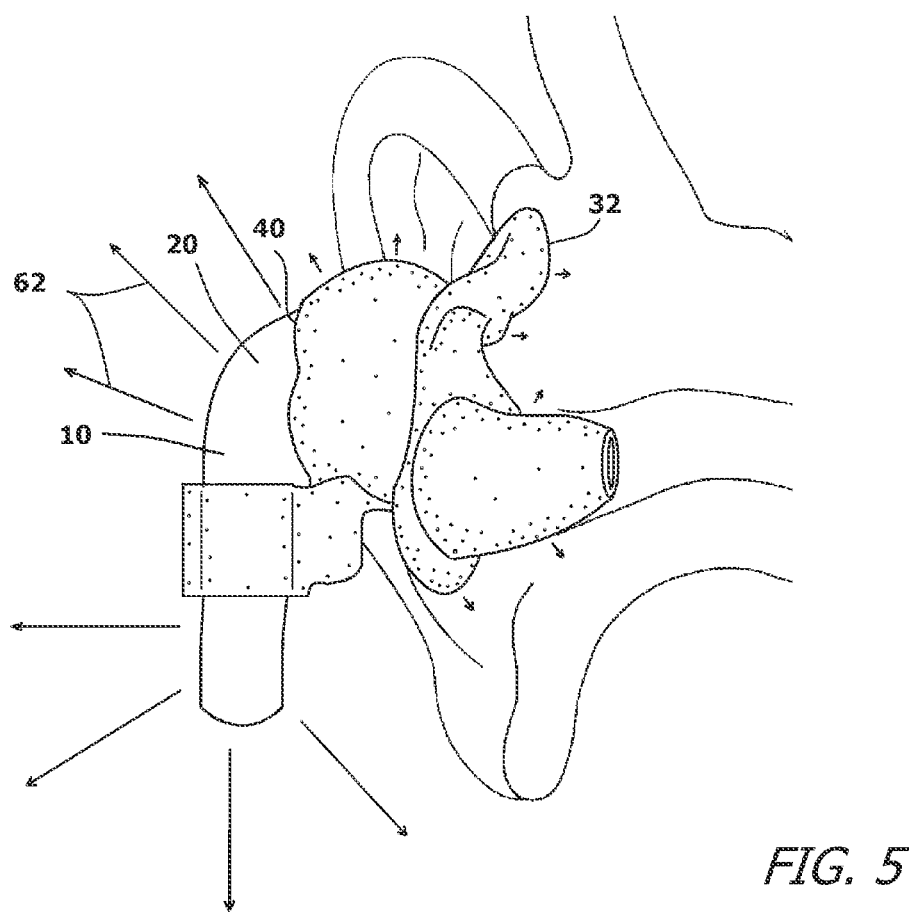
FIG. 5 shows a pattern of UHF radiation attenuation when an earpiece is placed within the earpiece radiation attenuation system.

Referring to FIG. 5 in conjunction with FIG. 3 and FIG. 1, it will be understood that the radiation field 62 radiating from the bulbous head 20 of the earpiece 10 in the UHF range is generally omnidirectional. There is a diminished area in front of the speaker 22 because the radiation does not pass well through the construction of the speaker 22.

Once the bulbous head 20 of the earpiece 10 is placed inside the first compartment 40 of the elastomeric molding 32, the radiation field 62 directed toward the user is greatly diminished. The degree of radiation attenuation is directly proportional to the thickness of the elastomeric molding 32 between the earpiece 10 and the user. The first section 34 that surrounds the bulbous head 20 of the earpiece 10 is thin. This enables transmissions to be sent and received between the earpiece 10 and the remote device 14. However, the contoured flange 42 is positioned between the earpiece 10 and the ear. This area of the elastomeric molding 32 is thick and can block between 50% and 90% of the UHF radiation traveling in the direction of the ear. The blockage of the UHF radiation is created by the synergistic effect of the ingredients contained within the unique formulation of the specialized compound 50. The conduciveness of the conductive powder 54 forms a Faraday cage that limits the propagation of electromagnetic radiation. The high-density powder 56 absorbs radiation well and prevents any electromagnetic radiation from passing through the specialized compound 50 without being attenuated. Lastly, the dielectric material 58 and polymer base 52 localize any electromagnetic radiation and prevent lateral propagation out of the elastomeric molding 32 and into the skin. Furthermore, if the dielectric material 58 is provided in the form of glass microspheres, the diameters of the microspheres can be specifically sized to be reflective to UHF radiation. In this manner, the UHF radiation will reflect back from the microspheres and cancel or attenuate the incoming radiation.

Returning to FIG. 3, it can be seen that the conduit 46 leads through the conical plug 44. The conduit 46 is used to propagate the audible signals 16 into the auditory canal 18. The conduit 46 is small and follows a non-linear path. Audible signals 16 travel well along the non-linear path. UHF radiation does not. The UHF signals 12 are absorbed by the specialized compound 50 as the UHF radiation contacts the walls of the non-linear conduit 46. This in combination with the fact that the UHF radiation is weakest in front of the speaker 22, creates a condition where the UHF radiation entering the auditory canal 16 can be reduced by up to ninety percent.

Figure 6:
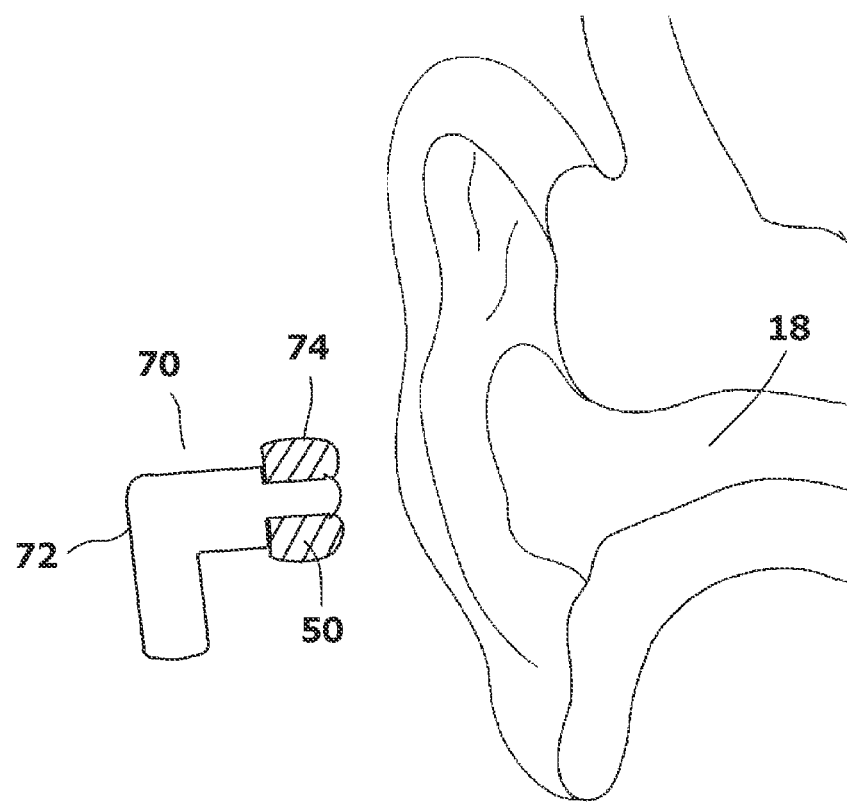
FIG. 6 shows an exemplary embodiment of an alternate earpiece radiation attenuation system shown in conjunction with an earpiece and an ear.

Referring to FIG. 6, an alternate embodiment of an earpiece 70 is shown. In this embodiment, an earpiece 70 is provided that has a molded plug 72 that extends into the auditory canal 18. An annular cushion 74 is positioned around the molded plug 72 to provide comfort and to secure the earpiece 70 in place. The annular cushion 74 can be selectively removed and replaced.

In the shown embodiment, the annular cushion 74 is made from the specialized compound 50 of the present invention. The area protected by the annular cushion 74 is limited by its size. However, the annular cushion 74 can still attenuate the UHF radiation in and around the auditory canal 18 by over fifty percent. This is significant since most people who have sensitivity to UHF radiation state that it is the tissue within the auditory canal 18 that becomes irritated. Thus, by reducing the UHF entering the auditory canal 18 many reports of irritation can be avoided.

It will be understood that the embodiments of the present invention that are illustrated and described are merely exemplary and that a person skilled in the art can make many variations to those embodiments. All such embodiments are intended to be included within the scope of the present invention as defined by the claims.

What is claimed is:

1. An earpiece radiation attenuation device, comprising:
   an elastomeric molding that connects to an earpiece that emits UHF radiation, wherein said elastomeric molding contains metal powder homogenously dispersed within a polymer base that attenuates said UHF radiation passing through said elastomeric molding.

2. The device according to claim 1, wherein said metal powder includes a conductive powder selected from a group consisting of copper powder, silver powder, gold powder and zinc powder.

3. The device according to claim 2, wherein said metal powder includes a high-density powder selected from a group consisting of tungsten powder, hastelloy powder and stainless steel powder.

4. The device according to claim 1, further including dielectric material homogenously dispersed within said polymer base.

5. The device according to claim 4, wherein said polymer base is present between 8.0 and 15.0 parts by weight, said metal powder is present between 2.5 and 11.0 parts by weight and said dielectric material is present between 0.1 and 1.0 parts by weight.

6. The device according to claim 5, wherein said metal powder includes copper powder present between 0.5 and 5.0 parts by weight.

7. The device according to claim 6, wherein said metal powder includes tungsten powder present between 2.0 and 6.0 parts by weight.

8. The device according to claim 1, wherein said dielectric material is glass microspheres.

9. The device according to claim 1, wherein said polymer base is an elastomeric material.

10. The device according to claim 9, wherein said elastomeric material is selected from a group consisting of silicone and thermoplastic rubbers.

11. The device according to claim 1, wherein said elastomeric molding defines a chamber into which a section of said earpiece can be inserted.

12. The device according to claim 11, wherein said elastomeric molding includes a plug that is shaped to fit within an ear.

13. The device according to claim 12, wherein said plug defines a non-linear conduit that extends into said chamber.

14. The device according to claim 12, wherein said elastomeric molding includes a flange disposed between said chamber and said plug.

15. The device according to claim 14, wherein said flange is contoured to match anatomical features of an ear.

16. A method of attenuating UHF radiation exposure to an ear that is emitted by an earpiece, said method comprising:
   creating an elastomeric molding that contains metal powder and dielectric material homogenously disposed in a polymer base;
   positioning said elastomeric molding between the earpiece and the ear so that said elastomeric molding attenuates said UHF radiation emitted by said earpiece that travels toward said ear.

17. The method according to claim 16, wherein creating an elastomeric molding that contains metal powder includes creating an elastomeric molding that contains a first conductive powder and a second high-density powder that is higher in density than said first conductive powder.

18. The method according to claim 17, wherein creating an elastomeric molding that contains metal powder and dielectric material includes providing glass beads as said dielectric material in an amount between 0.1 and 1.0 parts by weight.

19. The method according to claim 18, wherein said first conductive powder is copper powder and is present between 0.5 and 5.0 parts by weight.

20. The method according to claim 19, wherein said high-density powder is tungsten powder and is present between 2.0 and 6.0 parts by weight.

* * * * *